US008189636B2

(12) United States Patent
Mathes

(10) Patent No.: US 8,189,636 B2
(45) Date of Patent: May 29, 2012

(54) ELECTRICAL OVERSTRESS EVENT INDICATOR ON ELECTRONIC CIRCUITRY

(75) Inventor: David Todd Mathes, Sherman, TX (US)

(73) Assignee: Finisar Corporation, Sunnyvale, CA (US)

( * ) Notice: Subject to any disclaimer, the term of this patent is extended or adjusted under 35 U.S.C. 154(b) by 0 days.

(21) Appl. No.: 12/891,688

(22) Filed: Sep. 27, 2010

(65) Prior Publication Data

US 2011/0012739 A1 Jan. 20, 2011

Related U.S. Application Data

(62) Division of application No. 11/756,459, filed on May 31, 2007, now abandoned.

(60) Provisional application No. 60/809,667, filed on May 31, 2006.

(51) Int. Cl.
*H01S 3/04* (2006.01)
*H01S 5/00* (2006.01)

(52) U.S. Cl. .................. 372/43.01; 372/38.09; 977/949; 977/950; 977/951; 252/512; 252/513; 252/514; 252/515; 252/516; 252/517; 252/518.1; 252/519.1; 252/520.1; 252/521.1

(58) Field of Classification Search ............... 372/43.01, 372/38.09; 977/949–951; 252/512–521.1
See application file for complete search history.

(56) References Cited

U.S. PATENT DOCUMENTS

| 6,185,240 | B1* | 2/2001 | Jiang et al. ............... 372/50.124 |
| 6,686,697 | B2* | 2/2004 | Cho et al. ....................... 315/149 |
| 6,912,361 | B2* | 6/2005 | Aronson et al. .............. 398/135 |
| 7,065,121 | B2* | 6/2006 | Filgas et al. .................... 372/64 |
| 2003/0026552 | A1 | 2/2003 | Goode |
| 2005/0025449 | A1* | 2/2005 | Dirkson et al. ............... 385/147 |
| 2005/0047730 | A1* | 3/2005 | Ellison ........................... 385/92 |
| 2005/0083163 | A1* | 4/2005 | Shrier ............................. 337/16 |
| 2005/0196111 | A1* | 9/2005 | Burdick et al. ................. 385/92 |
| 2005/0244095 | A1 | 11/2005 | Ellison |
| 2006/0032665 | A1* | 2/2006 | Ice ................................ 174/254 |
| 2006/0274799 | A1* | 12/2006 | Collins et al. ............. 372/38.09 |
| 2008/0050113 | A1 | 2/2008 | Mathes |

OTHER PUBLICATIONS

Engineering Resistor Dictionary, pp. 1-5, Apr. 22, 2010.
Ernest Keenen et al. "Terahertz and laswer imaging for printed circuit board failure detection" 2004 IEEE Autotestco, pp. 563-569.
The Computer Desktop Encyclopedia, pp. 1-6, Apr. 20, 2009.
U.S. Appl. No. 11/756,459, Mail Date Apr. 27, 2010, Office Action.
U.S. Appl. No. 11/756,459, Mail Date Aug. 14, 2009, Office Action.
U.S. Appl. No. 11/756,459, Mail Date Apr. 22, 2009, Office Action.
U.S. Appl. No. 11/756,459, Mail Date Oct. 3, 2008, Office Action.

* cited by examiner

*Primary Examiner* — Jessica Stultz
*Assistant Examiner* — Delma R Forde
(74) *Attorney, Agent, or Firm* — Maschoff Gilmore & Israelsen

(57) ABSTRACT

Detecting electrical overstress events in electronic circuitry such as optical emitters. In one example embodiment, a laser includes an active area and a contact region in electrical communication with the active area. A portion of the contact region is configured to manifest a change in a visual attribute of the portion in response to exposure of the portion to an electrical overstress event.

14 Claims, 2 Drawing Sheets

ELECTRICAL OVERSTRESS EVENT INDICATOR ON ELECTRONIC CIRCUITRY

CROSS-REFERENCE TO RELATED APPLICATIONS

This application is a division of, and claims priority to, U.S. patent application Ser. No. 11/756,459, filed on May 31, 2007, which claims priority to U.S. Provisional Patent Application Ser. No. 60/809,667, filed on May 31, 2006, which both applications are incorporated herein by reference in their entirety.

BACKGROUND

1. The Field of the Invention

The present invention relates to detecting malfunctions in electronic circuitry. More particularly, embodiments of the invention relate to detecting electrical overstress events in electronic circuitry such as optical emitters.

2. Related Technology

Electronic circuitry is increasingly integrated into data communication and data processing devices. For example, integrated circuits, often referred to as a microchips or simply chips, are used in a variety of applications, such as high speed optical networks. One type of chip, the laser diode chip, plays an increasingly important role in modern high speed optical networks. Laser diode chips are complex semiconductor devices that convert an electrical data signal into an optical data signal. A laser diode chip, also known simply as a laser, is an essential component of a transmitter optical sub assembly (TOSA). A TOSA is often paired with a receiver optical sub assembly (ROSA) in an optoelectronic transceiver.

Examples of lasers that can be integrated into optoelectronic transceivers include vertical cavity surface emitting lasers (VCSELs) and edge emitting lasers. While VCSELs and edge emitting lasers exhibit desirable performance characteristics, they also have the unfortunate drawback of being very susceptible to electrical overstress (EOS) events. EOS events include events that can cause failure in a laser and are characterized by exposure of the laser to excessive voltage, current, and/or power. An electrostatic discharge (ESD) event is a particular type of EOS event where a rapid transfer of electrostatic charge occurs between two objects. EOS events, and ESD events in particular, can damage a laser in many ways, often resulting in observable signs of damage or failure attributes.

EOS damage is not always obvious though. In fact, some EOS events damage a laser without leaving any apparent visible manifestation of the damage. Such EOS events can still render the laser non-functional, even if no physical anomalies are visibly evident. Less damaging EOS events may also occur. Although these less damaging EOS events may not render the laser non-functional, these EOS events can shift the parametric performance of the laser, thus causing the laser to produce an inaccurate optical data signal.

Often when an optoelectronic transceiver containing a malfunctional laser is returned by a customer, it becomes necessary for the manufacturer to determine what caused the laser to malfunction. For example, it may be necessary for the manufacturer of a particular optoelectronic transceiver to make a determination as to whether the laser of the optoelectronic transceiver malfunctioned due to an ESD event, or whether the laser malfunctioned due to some other cause, such as a growth defect in the laser. Where there is no apparent visible manifestation of on a laser surface, the processes of performing a failure analysis on the laser can be very costly in terms of time and expense.

It would therefore be useful to be able to readily detect the occurrence of an EOS event which caused a particular laser to malfunction in order to save the time and expense of performing a failure analysis on the laser.

BRIEF SUMMARY OF SOME EXAMPLE EMBODIMENTS

In general, example embodiments of the invention relate to detecting electrical overstress events in electronic circuitry such as optical emitters. Some example embodiments of the invention can provide a visual cue to anyone inspecting a laser that an electrical overstress (EOS) event has occurred.

In one example embodiment, a laser includes an active area and a contact region in electrical communication with the active area. A portion of the contact region is configured to manifest a change in a visual attribute of the portion in response to exposure of the portion to an electrical overstress event.

In another example embodiment, a laser includes an active area, a contact region in electrical communication with the active area, and a sacrificial element. The sacrificial element and the contact region are electrically connected to the active area. The sacrificial element is also configured to be visibly altered in response to exposure of the contact region to an electrical overstress event.

In yet another example embodiment, a laser includes an active area, a contact region in electrical communication with the active area, and a means for visibly manifesting exposure of the contact region to an electrical overstress event.

In another example embodiment, an optoelectronic transceiver includes a housing, a ROSA at least partially positioned within the housing, and a TOSA at least partially positioned within the housing. The TOSA includes a laser. The laser includes an active area, a contact region in electrical communication with the active area, and a means for visibly manifesting exposure of the contact region to an electrical overstress event.

These and other aspects of example embodiments of the present invention will become more fully apparent from the following description and appended claims.

BRIEF DESCRIPTION OF THE DRAWINGS

To further clarify the above and other aspects of example embodiments of the present invention, a more particular description of these examples will be rendered by reference to specific embodiments thereof which are disclosed in the appended drawings. It is appreciated that these drawings depict only example embodiments of the invention and are therefore not to be considered limiting of its scope. It is also appreciated that the drawings are diagrammatic and schematic representations of example embodiments of the invention, and are not limiting of the present invention nor are they necessarily drawn to scale. Example embodiments of the invention will be disclosed and explained with additional specificity and detail through the use of the accompanying drawings in which.

DETAILED DESCRIPTION OF SOME EXAMPLE EMBODIMENTS

Example embodiments of the present invention enable the visual detection of the occurrence of electrical overstress (EOS) events in electronic circuitry. For example, embodiments of the invention can be lasers, such as vertical cavity surface emitting lasers (VCSELs). A laser can be integrated into various optical components including transmitter optical sub assemblies (TOSAs). A TOSA can be integrated together with a receiver optical sub assembly (ROSA) in the housing of an optoelectronic transceiver.

1. Example Optoelectronic Transceiver Module

Figure 1:
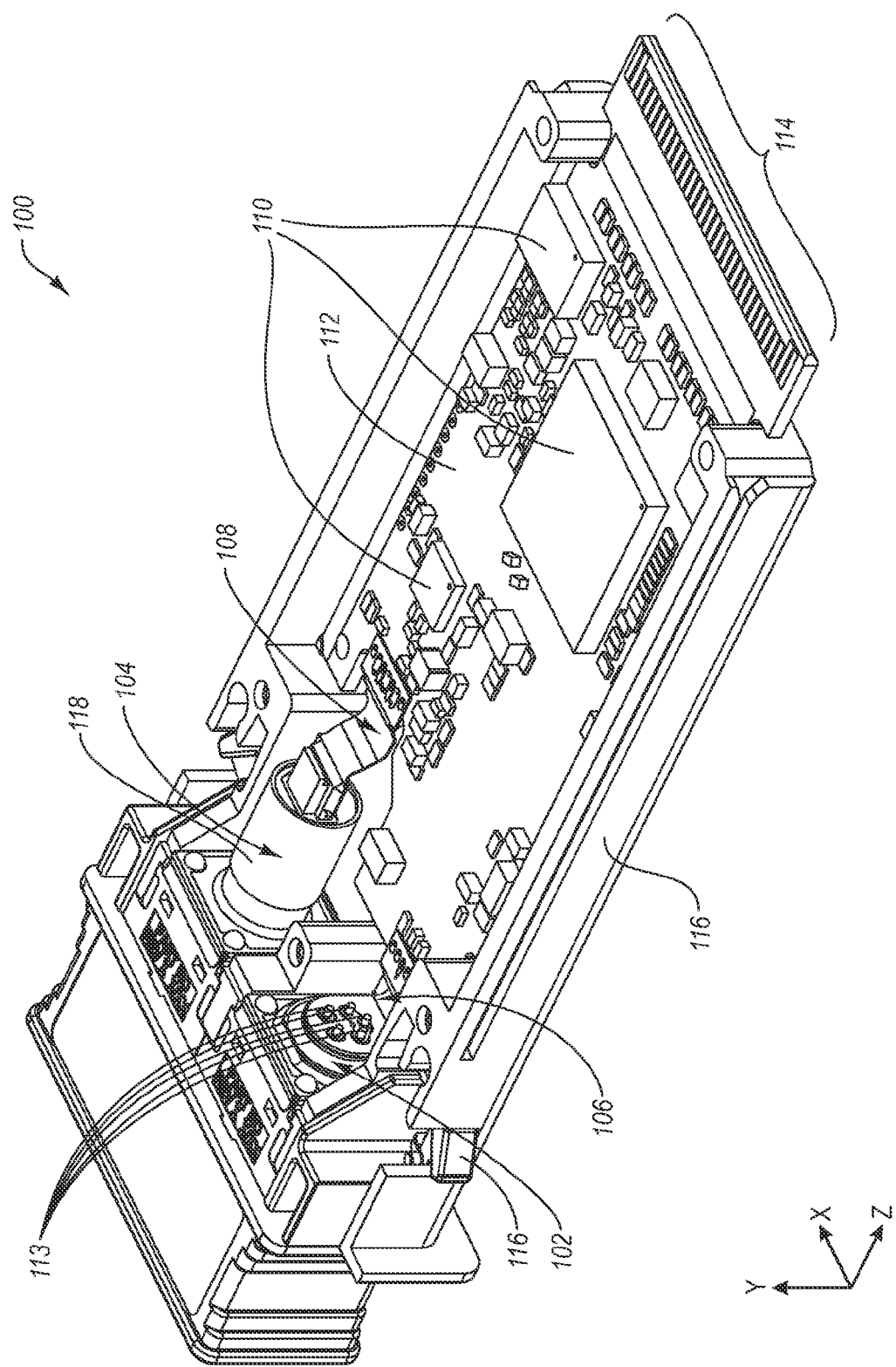
FIG. 1 is a perspective view of an optoelectronic transceiver module that serves as one example environment in which example embodiments of the present invention can be practiced.

Reference is first made to FIG. 1, which is a perspective view of an example optoelectronic transceiver module ("transceiver"), generally designated at 100, for use in transmitting and receiving optical signals in connection with an external host device (not shown). As disclosed in FIG. 1, the transceiver 100 includes various components, including a receiver optical subassembly ("ROSA") 102, a transmitter optical subassembly ("TOSA") 104, electrical interfaces 106 and 108, various electronic components 110, and a printed circuit board ("PCB") 112. In detail, the two electrical interfaces 106 and 108 electrically connect the ROSA 102 and the TOSA 104, respectively, to a plurality of conductive pads located on the PCB 112. As disclosed in connection with the ROSA 102, the electrical interface 106 is connected to a group of metal posts 113 which are electrically connected to an optical receiver (not shown) housed within the ROSA 102. Although not disclosed in FIG. 1, the electrical interface 108 could be similarly connected to metal posts (not shown) of the TOSA 104 which are electrically connected to an optical transmitter (not shown) housed within the TOSA 104.

The electronic components 110 are also operably attached to the PCB 112. An edge connector 114 is located on an end of the PCB 112 to enable the transceiver 100 to electrically interface with a host device (not shown). As such, the PCB 112 facilitates electrical communication between the ROSA 102/TOSA 104 and the host device. In addition, the above-mentioned components of the transceiver 100 are partially housed within a shell 116. The shell 116 can cooperate with a covering portion (not shown) to define a housing for the components of the transceiver 100.

The transceiver 100 can be configured for optical signal transmission and reception at a variety of per-second data rates including, but not limited to, 1 Gbit, 2 Gbit, 2.5 Gbit, 4 Gbit, 8 Gbit, 10 Gbit, 10.3 Gbit, 10.5 Gbit, or higher. Further, the transceiver 100 can be configured for optical signal transmission and reception at various wavelengths including, but not limited to, 850 nm, 1310 nm, 1470 nm, 1490 nm, 1510 nm, 1530 nm, 1550 nm, 1570 nm, 1590 nm, or 1610 nm. Also, the transceiver 100 can be configured to support various communication protocols including, but not limited to, Fast Ethernet, Gigabit Ethernet, 10 Gigabit Ethernet, and 1x, 2x, 4x, and 10x Fibre Channel. Further, the transceiver 100 can be configured to operate at various temperature ranges including, but not limited to, 0° C. to 70° C. In addition, the transceiver 100 can be configured to have a variety of different form factors that are substantially compliant with various transceiver and/or transponder MSAs including, but not limited to, SFF, SFP, XFP, XPAK, X2, or XENPAK.

With continued reference to FIG. 1, the TOSA 104 includes a barrel 118 within which an optical transmitter, such as a laser (not shown), is positioned. The optical transmitter is configured to convert electrical signals received through the PCB 112 from a host device (not shown) into corresponding optical signals. Accordingly, the TOSA 104 serves as an electro-optic transducer. The TOSA 104 also defines a port (not shown). The port is configured to optically connect the optical transmitter positioned within the barrel 118 with the fiber-ferrule portion of an optical fiber connector (not shown).

Having described a specific environment with respect to FIG. 1, it will be understood that this specific environment is only one of countless architectures in which example embodiments of the present invention may be employed. As previously stated, example embodiments of the present invention are not intended to be limited to any particular environment.

2. Example Optical Emitters

Figure 2:
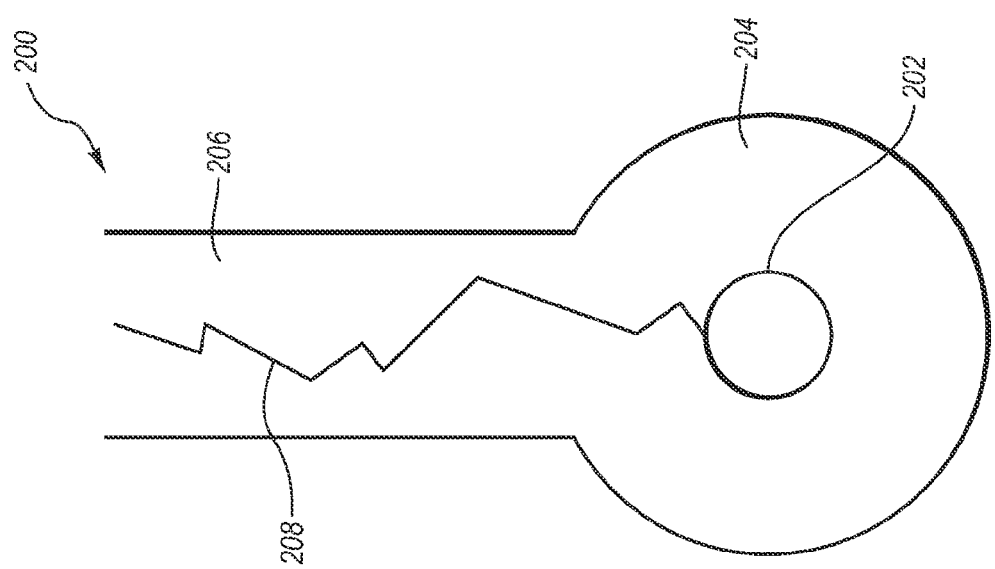
FIG. 2 discloses aspects of an example optical emitter, such as a vertical cavity surface emitting laser (VCSEL)

FIG. 2 is a top view of an example VCSEL 200 that is configured according to one example embodiment of the present invention. The VCSEL 200 is typically fabricated on a semiconductor wafer along with hundreds or thousands of other VCSELs. The VCSEL 200 includes an active area 202 through which laser light is emitted in a direction perpendicular to the active area 202. The VCSEL 200 also includes a generally round contact region 204 which connects, in this example embodiment, to a generally rectangular contact region 206. The contact regions 204 and 206 are in electrical communication with the active area 202. In particular, current is injected into the VCSEL 200 through the contact regions 204 and 206 in order to provide electrical power to the VCSEL 200. Light is then emitted from the VCSEL 200 as a result of the current injection. In the example VCSEL 200 of FIG. 2, the contact regions 204 and 206 comprise an electrically conductive material, such as a metal or a metal alloy.

In addition, one or both of the contact regions 204 and 206 also incorporate a means for visibly manifesting exposure of the contact regions 204 and/or 206 to an EOS event. The means for visibly manifesting exposure to an EOS event can generally include multiple means. In one example embodiment, the means for visibly manifesting exposure to an EOS event in the VCSEL 200 is implemented as a chemical or polymer configured to change color, texture, or other visibly perceptible characteristic upon exposure to an EOS event.

For example, the metal from which the contact regions 204 and 206 are fabricated could be coated with, or otherwise include, a chemical or polymer which causes the metal to change color upon the exposure of the metal to an EOS event. In one example, if the expected EOS event is an electrostatic discharge (ESD) event, contact regions 204 and/or 206 can be coated with an ESD-sensitive paint. The ESD-sensitive paint can, for example, include nano-crystals that are configured to change direction such that the nano-crystals are substantially oriented along the discharge path of the ESD event. This change of orientation can result in a change of color from, for example, bright gold to dark red. The ESD-sensitive paint could be similar to a thermal-indicating paint that is configured to change color at a given temperature. In this example, the appearance of a dark red path along the surface of contact regions 204 and/or 206 would indicate both that an ESD event had occurred, and would also identify at least a portion of the discharge path associated with the ESD event.

An example discharge path beginning at the active area 202 and extending across the contact regions 204 and 206 is indicated generally in FIG. 2 as a discharge path 208. In this example, prior to the occurrence of the ESD event, the contact regions 204 and 206 appeared to be bright gold in color, but subsequent to the ESD event, the discharge path 208 across the contact regions 204 and 206 turned dark red in color while the remainder of the contact regions 204 and 206 remained bright gold in color. The colors bright gold and dark red are examples only, and any other color combination could be substituted in the above example. Likewise, a change in color contrast or brightness, such as where a color becomes lighter or darker, could also be substituted in the above example.

Alternatively, the metal from which the contact regions 204 and 206 are fabricated could be coated with, or otherwise include, a chemical or polymer which causes the metal to change texture upon the exposure of the metal to an ESD event. For example, the texture of the metal could change from being smooth and reflective to being rough and dull upon the exposure of the metal to an ESD event. In this example, the example discharge path 208 would appear smooth and shiny in texture prior to the occurrence of an ESD event, but subsequent to the occurrence of the ESD event, the discharge path 208 would appear rough and dull in texture. This alternative configuration would indicate both that an ESD event had occurred, and would also identify at least a portion of the discharge path associated with the ESD event. The smooth and rough textures are examples only, and any other texture, or combination, could be substituted in the above example.

In general, anything that visually distinguishes the EDS affected portion of a device from unaffected portions can be employed and the scope of the invention is not limited to the disclosed examples.

Likewise, a combination of visibly perceptible characteristics, such as color and texture, can be used to visibly indicate the occurrence of an EOS event. Furthermore, any electrically conductive material that is electrically connected to a laser can be configured to change color, texture, or other visibly perceptible characteristic upon exposure to an EOS event, as disclosed herein. For example, where a VCSEL is implemented in a fiber optics system and positioned inside a housing of a TOSA, such as the housing 118 of the TOSA 204, one or more metal posts of the TOSA can include the chemical/polymer which functions as disclosed herein. A change in appearance of one or more of the metal posts of the TOSA 204 according to this configuration would indicate both that an EOS event has occurred, and would also identify at least a portion of the discharge path associated with the EOS event.

In each of the above examples, the occurrence and discharge path of an EOS event can be detected by a visual inspection of one or more surfaces of the VCSEL 200 or associated electrically conductive material that is electrically connected to the VCSEL 200. This visual inspection can be performed in some circumstances with the assistance of a surface inspection instrument such as, for example, a scanning electron microscope. Even where the occurrence of an EOS event does not result in catastrophic failure of the VCSEL 200, the example embodiment of FIG. 2 provides a visual cue, to anyone inspecting the VCSEL 200 and/or related components such as the metal posts of the TOSA discussed above, that an EOS event had occurred. Knowledge that an EOS event has occurred can then be used in deciding what remedial actions may need to be taken in order to insure proper functioning of the component into which the VCSEL 200 is integrated, in deciding how to compensate a customer who purchased the component for any malfunction of the component, or in deciding how to alter the design of the VCSEL 200 and/or the VCSEL 200 production process.

Figure 3:
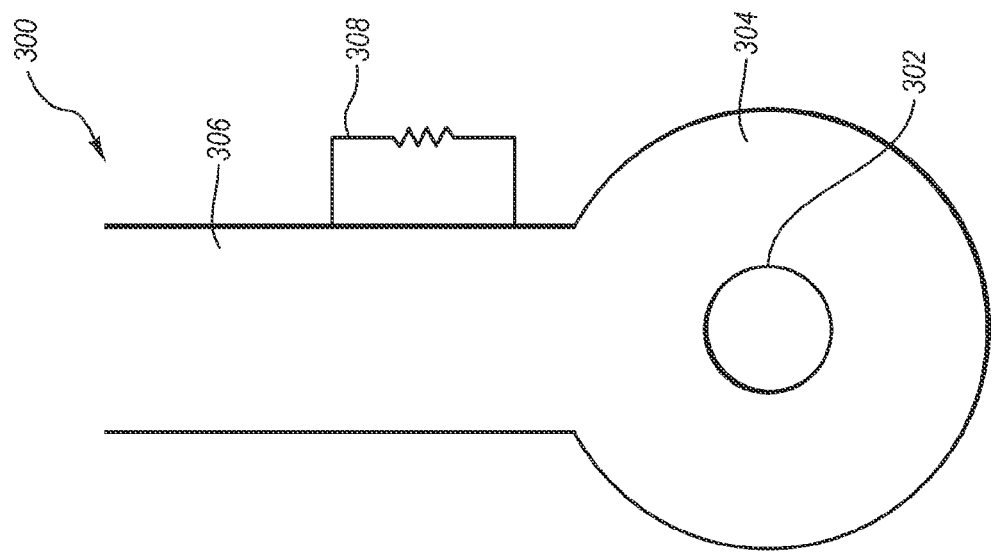
FIG. 3 discloses aspects of another example optical emitter, such as a VCSEL.

FIG. 3 is a top view of an example VCSEL 300 that is configured according to another example embodiment of the present invention. The VCSEL 300 can be fabricated on a wafer in a similar manner as the VCSEL 200 of FIG. 2. Also similar to the VCSEL 200, the VCSEL 300 includes an active area 302 and contact regions 304 and 306. In addition, the VCSEL 300 includes a means for visibly manifesting exposure of the contact regions 304 and/or 306 to an EOS event.

The means for visibly manifesting exposure of the contact regions 304 and/or 306 in the VCSEL 300 is a sacrificial element whose only purpose is to be visibly altered in response to the occurrence of an EOS event. The example sacrificial element illustrated in FIG. 3 is a resistor circuit 308. The resistor circuit 308 and the contact region 306 are electrically connected in parallel with respect to the active area 302. The resistor circuit 308 is configured to visibly burn out when an EOS event occurs in the vicinity of the contact region 306. The term "burn out" in this context refers to the destruction of a sacrificial element from excessive current or power dissipation such as occurs as a result of an EOS event. When the resistor circuit 308 burns out, the resistor circuit 308 will change in appearance due to one or more of carbonization of plastic around the resistor circuit 308, metal reflow around the resistor circuit 308, and/or discoloration of the metal around the resistor circuit 308. The resistor circuit 308 is only one example of a sacrificial element, and the resistor circuit 308 can be replaced with any other sacrificial element or elements of comparable functionality including more complex circuits containing any combination of circuit elements, for example, capacitors and/or diodes.

Since the resistor circuit 308 is located adjacent to the contact region 306, when an EOS event occurs in the vicinity of the contact region 306, the resistor circuit 308 will burn out and the appearance of the resistor circuit 308 will visibly indicate that an EOS event has occurred along the contact region 306 of the VCSEL 300. Therefore, in the example embodiment of FIG. 3, the occurrence and approximate discharge path of an EOS event on the VCSEL 300 can be detected visually by inspecting the resistor circuit 308. The VCSEL 300 could include multiple resistor circuits similar to the resistor circuit 308, or other similar sacrificial elements of comparable functionality, in order to enable further detection and pinpointing of the occurrence of EOS events. As the foregoing makes clear, resistor circuits and other devices and systems of comparable functionality, comprise yet further example structural implementations of a means for visibly manifesting exposure to an EOS event. Any other structural implements of comparable functionality may additionally, or alternatively, be employed. In addition, variables such as size of resistor can be adjusted to suit application requirements.

Even where the occurrence of an EOS event does not result in catastrophic damage to the VCSEL 300, the example embodiment of FIG. 3 provides a visual cue, to anyone inspecting the VCSEL 300, that an EOS event had occurred. Likewise, where the resistor circuit 308 is configured to burn out at the same time that the VCSEL 300 fails, it can easily be determined by visually examining the resistor circuit 308 whether the cause of failure of the VCSEL 300 was due to an EOS event or due to some other cause, such as a growth defect. For example, when the VCSEL 300 fails, the resistor circuit 308 can be examined. If an examination of the resistor circuit 308 reveals that the resistor circuit 308 has burned out, then it can be determined that an EOS event was the cause of the VCSEL 300 failure. On the other hand, if an examiner of the resistor circuit 308 reveals that the resistor circuit 308 has not burned out, then it can be determined that the failure of the VCSEL 300 was not caused by an EOS event.

Knowledge that an EOS event has occurred can then be used, for example, in deciding what remedial actions may need to be taken in order to insure proper functioning of the component into which the VCSEL 300 is integrated, in deciding how to compensate a customer who purchased the component for any malfunction of the component, or in deciding how to alter the design of the VCSEL 300 and/or the VCSEL 300 production process.

Although the examples disclosed herein relate generally to apparatuses that enable detection of EOS events in lasers such as VCSELs, example embodiments of the invention are not limited to lasers or VCSELs, but extend instead to all electronic circuitry and other integrated circuits where the detection of EOS events would prove beneficial. Example embodiments of the invention also extend to any means for visibly manifesting exposure to an EOS event, and are not limited to the example means for visibly manifesting exposure to EOS events disclosed herein.

The present invention may be embodied in other specific forms without departing from its spirit or essential characteristics. The disclosed embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A laser comprising:
    an active area;
    a metal contact region in electrical communication with the active area; and
    a coating on the contact region configured to manifest a change in a visual attribute of the coating in response to exposure of the contact region to an electrical overstress event, wherein the coating includes nano-crystals that are configured to change direction such that the nano-crystals are substantially oriented along a discharge path of the electrical overstress event such that this change of orientation results in a change of color.

2. The laser as recited in claim 1, wherein the coating is further configured to manifest a change in a texture in response to exposure of the contact region to an electrical overstress event.

3. The laser as recited in claim 1, wherein the coating is further configured to manifest a change in a color contrast in response to exposure of the contact region to an electrical overstress event.

4. The laser as recited in claim 1, wherein the laser comprises a VCSEL.

5. An optoelectronic transceiver comprising:
    a housing;
    a ROSA at least partially positioned within the housing; and
    a TOSA at least partially positioned within the housing and including the laser as recited in claim 1.

6. The laser as recited in claim 1, wherein the discharge path begins at the active area and extends across the contact region.

7. The laser as recited in claim 1, wherein the coating comprises thermal indicating paint that is configured to change color at a given temperature.

8. The laser as recited in claim 1, wherein the coating comprises a chemical or polymer that causes the metal of the contact region to change texture from being smooth and reflective to being rough and dull upon exposure to the electrical overstress event.

9. A transmitter optical sub assembly (TOSA) comprising:
    a laser including:
        an active area; and
        a contact region in electrical communication with the active area, a portion of the contact region being configured to manifest a change in a visual attribute of the portion in response to exposure of the portion to an electrical overstress event;
    a housing within which the laser is positioned; and
    means located outside of the housing for visibly manifesting exposure of the contact region to an electrical overstress event, the means for visibly manifesting exposure including a coating, wherein the coating includes nano-crystals that are configured to change direction such that the nano-crystals are substantially oriented along a discharge path of the electrical overstress event such that this change of orientation results in a change of color.

10. The TOSA as recited in claim 9, wherein the means located outside of the housing for visibly manifesting exposure of the contact region to an electrical overstress event further includes one or more metal posts of the TOSA that change in appearance in response to exposure to an electrical overstress event.

11. An optoelectronic transceiver comprising:
    a housing;
    a ROSA at least partially positioned within the housing; and
    a TOSA at least partially positioned within the housing and including a laser, the laser comprising:
        an active area;
        a metal contact region in electrical communication with the active area; and
        a coating on the contact region configured to visibly manifest exposure of the contact region to an electrical overstress event, wherein the coating includes nano-crystals that are configured to change direction such that the nano-crystals are substantially oriented along a discharge path of the electrical overstress event such that this change of orientation results in a change of color.

12. The optoelectronic transceiver as recited in claim 11, wherein the laser comprises a VCSEL.

13. The optoelectronic transceiver as recited in claim 11, wherein the coating is further configured to manifest a change in a texture of the coating in response to exposure of the contact region to an electrical overstress event.

14. An optoelectronic transceiver comprising:
    a transceiver housing;
    a ROSA at least partially positioned within the transceiver housing; and
    the TOSA as recited in claim 9 at least partially positioned within the transceiver housing.

* * * * *